US008941138B2

(12) United States Patent
Yu et al.

(10) Patent No.: US 8,941,138 B2
(45) Date of Patent: Jan. 27, 2015

(54) SEMICONDUCTOR STRUCTURE COMPRISING A STACKED DIELECTRIC LAYER

(75) Inventors: Tzung-Wei Yu, Hsinchu (TW); Fang-An Shu, Hsinchu (TW); Yao-Chou Tsai, Hsinchu (TW); Kuan-Yi Lin, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 10 days.

(21) Appl. No.: 13/620,725

(22) Filed: Sep. 15, 2012

(65) Prior Publication Data

US 2014/0021473 A1    Jan. 23, 2014

(30) Foreign Application Priority Data

Jul. 18, 2012 (TW) .............................. 101125882 A

(51) Int. Cl.
 *G02F 1/1335* (2006.01)
(52) U.S. Cl.
 USPC .......... 257/98; 257/59; 257/E21.476; 438/30; 349/114
(58) Field of Classification Search
 CPC ............ H01L 27/3272; H01L 51/5237; G02F 1/133553
 USPC .......................... 257/59, 98; 349/114; 438/30
 See application file for complete search history.

(56) References Cited

U.S. PATENT DOCUMENTS

| | | | |
|---|---|---|---|
| 6,493,052 B1 * | 12/2002 | Satake et al. | 349/114 |
| 6,504,215 B1 | 1/2003 | Yamanaka et al. | |
| 6,522,067 B1 * | 2/2003 | Graff et al. | 313/512 |
| 6,642,085 B1 | 11/2003 | Wolfe et al. | |
| 6,825,070 B2 | 11/2004 | Yamanaka et al. | |
| 7,012,658 B2 | 3/2006 | Sawasaki et al. | |
| 7,268,842 B2 | 9/2007 | Sawasaki et al. | |
| 7,696,524 B2 | 4/2010 | Ikeda et al. | |
| 7,764,340 B2 | 7/2010 | Inaba et al. | |
| 2008/0111959 A1 * | 5/2008 | Su et al. | 349/114 |
| 2009/0153953 A1 * | 6/2009 | Banerjee et al. | 359/359 |
| 2011/0108837 A1 * | 5/2011 | Yamazaki et al. | 257/43 |
| 2011/0127593 A1 | 6/2011 | Hayashi | |

FOREIGN PATENT DOCUMENTS

| | | |
|---|---|---|
| TW | 200822365 | 5/2008 |
| TW | 201135941 | 10/2011 |

OTHER PUBLICATIONS

"Office Action of Taiwan Counterpart Application", issued on Oct. 13, 2014, p. 1-6.

* cited by examiner

*Primary Examiner* — John C Ingham
(74) *Attorney, Agent, or Firm* — Jianq Chyun IP Office

(57) ABSTRACT

A semiconductor structure includes a gate, an oxide channel layer, a gate insulating layer, a source, a drain and a dielectric stacked layer. The oxide channel layer is stacked over the gate, with the gate insulting layer disposed therebetween. The source and the drain are disposed on a side of the oxide channel layer and in parallel to each other. A portion of the oxide channel layer is exposed between the source and the drain. The dielectric stacked layer is disposed on the substrate and includes plural of first inorganic dielectric layers with a first refraction index and plural of second inorganic dielectric layers with a second refraction index that are stacked alternately. At least one of the first inorganic dielectric layers directly covers the source, the drain and the portion of the oxide channel layer. The first refraction index is smaller than the second refraction index.

13 Claims, 1 Drawing Sheet

SEMICONDUCTOR STRUCTURE COMPRISING A STACKED DIELECTRIC LAYER

CROSS-REFERENCE TO RELATED APPLICATION

This application claims the priority benefit of Taiwan application serial no. 101125882, filed on Jul. 18, 2012. The entirety of the above-mentioned patent application is hereby incorporated by reference herein and made a part of this specification.

TECHNICAL FIELD

The invention relates to a semiconductor structure, and also relates to a semiconductor structure having an oxide channel layer.

BACKGROUND

The most popular liquid crystal display exemplified herein is mainly comprised of a thin film transistor (TFT) array substrate, a color filter substrate and a liquid crystal layer sandwiched between the two substrates. In a conventional TFT array substrate, an amorphous silicon (a-Si) TFT or a low-temperature polysilicon (LTPS) TFT often serves as a switching device of each sub-pixel. According to recent researches, the oxide semiconductor TFT has greater mobility than the a-Si TFT, and the oxide semiconductor TFT has a larger area and a lower production cost than the LTPS TFT. Hence, the oxide semiconductor TFT has great potential for becoming the key element of the next-generation flat display panel.

In a conventional oxide semiconductor TFT, the oxide channel layer is easily influenced by moisture and oxygen in the atmosphere, and the electrical property of the oxide channel layer may drift with time. Accordingly, the electrical performance and the reliability of the oxide semiconductor TFT are affected. Moreover, in the conventional oxide semiconductor TFT, the threshold voltage ($V_{th}$) of the oxide semiconductor layer is shifted due to the irradiation of a short wavelength light (i.e. an ultraviolet light), a device characteristic thereof is probably unstable, for example, a drain induced barrier lowering (DIBL) effect is probably occurred to cause a current leakage phenomenon of the device, which may influence a display quality. Accordingly, manufacturers now focus on improving the stability of an oxide channel layer by mitigating the influence of the external environment and the threshold voltage shift in an oxide semiconductor TFT resulted from the irradiation of a short wavelength light.

SUMMARY

An exemplary embodiment of the disclosure provides a semiconductor structure, in which a dielectric stacked layer is applied to mitigate the overall device electrical property and stability problems, which may be resulted from moisture and oxygen penetration into the oxide channel layer. Further, the dielectric stacked layer may reflect short wavelength light (i.e. an ultraviolet light).

An exemplary embodiment of the disclosures provides a semiconductor structure that includes a gate, an oxide channel layer, a gate insulating layer, a source, a drain and a dielectric stacked layer. The gate is disposed on the substrate. The channel oxide layer is disposed on the substrate and is stacked on the gate. The gate insulating layer is disposed between the gate and the oxide channel layer. The source and the drain are respectively disposed at a side of the oxide channel layer and are configured in parallel. A portion of the oxide channel layer is exposed between the source and the drain. The dielectric stacked layer is disposed on the substrate and includes a plurality of first inorganic dielectric layers with a first refractive index and a plurality of second inorganic dielectric layers with a second refractive index. The first inorganic dielectric layers and the second inorganic dielectric layers are alternately stacked. At least one of the inorganic dielectric layers directly covers the source, the drain and the exposed portion of the oxide channel layer. The first refractive index is smaller than the second refractive index.

According to an exemplary embodiment of the disclosure, each of the plurality of the first inorganic dielectric layers includes a silicon oxide layer.

According an exemplary embodiment of the disclosure, the above first refractive index is between 1.535 and 1.56.

According to an exemplary embodiment of the disclosure, each of the plurality of second inorganic dielectric layers includes a silicon nitride layer.

According to an exemplary embodiment of the disclosure, the above second refractive index is between about 1.98 and 2.08.

According to an exemplary embodiment of the disclosure, the above dielectric stacked layer further includes a plurality of third inorganic dielectric layers with a third refractive index. The plurality of the first inorganic dielectric layers, the plurality of the second inorganic dielectric layers and the plurality of the third inorganic dielectric layers are alternately disposed.

According to an exemplary embodiment of the disclosure, each of the plurality of third inorganic dielectric layers includes a silicon oxynitride layer.

According to an exemplary embodiment of the disclosure, the third refractive index is between 1.6 and 1.64.

According to an exemplary embodiment of the disclosure, a number of the stacked layers constituting by the first inorganic dielectric layers and the second inorganic dielectric layers is at least five.

According to an exemplary embodiment of the disclosure, a thickness of each of the plurality of the first inorganic dielectric layers is between 55 nanometers and 85 nanometers.

According to an exemplary embodiment of the disclosure, a thickness of each of the plurality of the second inorganic dielectric layers is between 55 nm and 85 nm.

According to an exemplary embodiment of the disclosure, the above oxide channel layer includes indium-gallium-zinc oxide (IGZO), zinc oxide (ZnO) or indium-zinc oxide (IZO).

According to an exemplary embodiment of the disclosure, the semiconductor structure further includes a transparent conductive layer disposed on the dielectric stacked layer. The dielectric stacked layer also includes a contact via, and the transparent conductive layer is electrically connected to the drain through the contact via.

According to the exemplary embodiments of the disclosure, the semiconductor structure includes a dielectric stacked layer, which is in direct contact with the source, the drain and the oxide channel layer. Hence, not only oxygen and moisture may be effectively prevented from entering into the oxide channel layer and the semiconductor structure may have better stability and electrical properties, the semiconductor structure may also selectively reflect short wavelength lights (such as UV lights). Accordingly, the photocurrent generated by the oxide channel layer due to light irradiation is reduced, and the photoelectric characteristics and the lifetime of the semiconductor structure are thereby enhanced.

The invention and certain merits provided by the invention can be better understood by way of the following exemplary embodiments and the accompanying drawings, which are not to be construed as limiting the scope of the invention.

DETAILED DESCRIPTION OF DISCLOSED EMBODIMENTS

Figure 1:
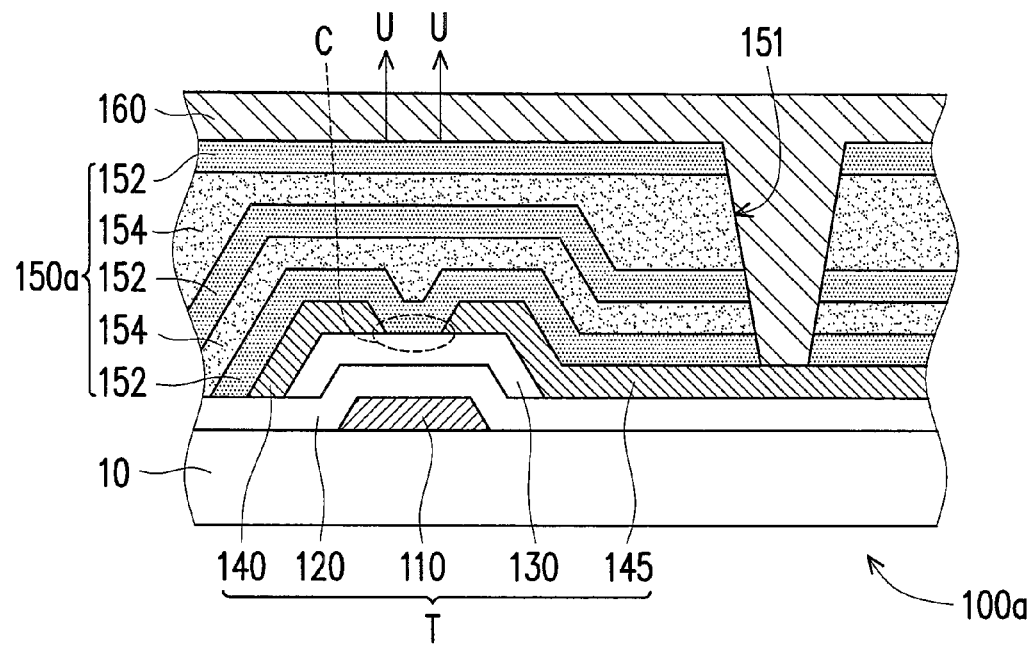
FIG. 1 is a schematic cross-sectional diagram of a semiconductor structure according to an exemplary embodiment of the disclosure.

FIG. 1 is a schematic cross-sectional diagram of a semiconductor structure according to an exemplary embodiment of the disclosure. Referring to FIG. 1, in this exemplary embodiment, the semiconductor structure 100a includes a gate 110, a gate insulation layer 120, an oxide channel layer 103, a source 140, a drain 145 and a dielectric stacked layer 150a.

More specifically, the gate 110 is disposed on a substrate 10, wherein the gate 110 may be formed with a metal stacked layer or a single layer of metal. A material of the gate 110 includes a type of metal with good conductivity, for example, aluminum, or copper, etc. The gate 110 may be constructed with a non-metal conductive material. The exemplary embodiment of the disclosure, however, is not limited as such. Moreover, the substrate 10 is a glass substrate or a plastic substrate. The oxide channel layer 130 is disposed on the substrate 10 and is stacked on the gate 110, wherein a material of the oxide channel layer 130 includes, but not limited to, indium-gallium-zinc oxide (IGZO), zinc oxide (ZnO) or indium-zinc oxide (IZO).

The gate insulating layer 120 is disposed between the gate 110 and the oxide channel layer 130. The source 140 and the drain electrode 145 are respectively disposed at a side of the oxide channel layer 130 and are configured in parallel. A portion C of the oxide channel layer 130 is exposed between the source 140 and the drain 145. The dielectric stacked layer 150a is disposed on the substrate 10 and the dielectric stacked layer 150a includes a plurality of first inorganic dielectric layers 152 with a first refractive index and a plurality of second inorganic dielectric layers 154 with a second refractive index. The first inorganic dielectric layers 152 and the second inorganic dielectric layers 154 are alternately stacked. Specifically, at least one of the first inorganic dielectric layers 152 directly covers the source 140, the drain 145 and the portion C of the oxide channel layer 130. The first refractive index is smaller than the second refractive index.

More specifically, in this exemplary embodiment, the first inorganic dielectric layers 152 are capable of precluding moisture and oxygen penetrations. An example of the first inorganic dielectric layers 152 is, but not limited to, a silicon oxide layer, and the first refractive index of the first inorganic dielectric layers 152 is, for example, between 1.535 and 1.56. The second inorganic dielectric layers 154 are capable of precluding moisture and oxygen. An example of the second inorganic dielectric layer 154 is, but not limited to, a silicon nitride layer. The second refractive index of the second inorganic dielectric layers 154 is, for example, between about 1.98 and 2.08. In one exemplary embodiment, the number of the stacked layers constituting by the first inorganic dielectric layers 152 and the second inorganic dielectric layers 154 in the dielectric stacked layer 150a is, for example, 5 layers. As shown in FIG. 1, three layers of the first inorganic dielectric layers 152 and two layers of the second inorganic dielectric layers 154 are alternately stacked to provide the dielectric stacked layer 150a with a five layer structure. Herein, the dielectric stacked layer 150a may be viewed as a type of one-dimensional photonic crystal structure. Furthermore, the thickness of the first inorganic dielectric layers 152 is between 55 nanometers and 85 nanometers, and the thickness of the second inorganic dielectric layers 154 is between 55 nanometers and 85 nanometers.

In addition, the semiconductor structure 100a of this exemplary embodiment further includes a transparent conductive layer 160, wherein the transparent conductive layer 160 is disposed on the dielectric stacked layer 150a. In this exemplary embodiment, the dielectric stacked layer 150a has a contact via 151, and the transparent conductive layer 160 is electrically connected with the drain 145 through the contact via 151. Herein, the transparent conductive layer 160 directly contacts the outmost first inorganic dielectric layer 152 of the dielectric stacked layer 150a. Certainly, the outmost layer of the dielectric stacked layers 150a may be the second inorganic dielectric layer 154. It should be noted that the configuration of the transparent conductive layer 160 in the foregoing description and examples are intended for illustration, not for limitation the scope of the disclosure. Herein, the semiconductor structure 100a may be viewed as a pixel structure, and the gate 110, the gate insulating layer 120, the oxide channel layer 130, the source 140, the drain 145 may constitute a thin film transistor T.

According to the semiconductor structure 100a of this exemplary embodiment, the dielectric stacked layer 150a serves as a passivation layer of the thin film transistor T, wherein the dielectric stacked layer 150a, which may be viewed as a one-dimensional photonic crystal structure, is constructed with the first inorganic dielectric layers 152 and the second inorganic dielectric layers 154 alternately stacked together, wherein the first inorganic dielectric layers 152 and the second inorganic dielectric layers 154 have different refractive indices and are capable of precluding moisture and oxygen from entering the oxide channel layer 130. In addition that the semiconductor structure 100a bears better stability and electrical properties, it may also selectively reflect short wavelength light (such as UV light) to lower the generation of photocurrent generated by the oxide channel layer 130 due to light irradiation. Accordingly, the photoelectrical property of the semiconductor structure 100a is enhanced.

It should be noted that although the dielectric stacked layer 150a in the foregoing description and examples include alternately stacking the first inorganic dielectric layers 152 and the second inorganic dielectric layers 154, the configuration of the dielectric stacked layer 150a is intended for illustration, not for limitation the scope of the disclosure. In other exemplary embodiments, the dielectric stacked layer 150a is not configured with the first inorganic dielectric layers 152 and the second inorganic dielectric layers 154 alternately stacked. Alternatively speaking, stacking with multiple layers of the first inorganic dielectric layer 152 and multiple layers of the second inorganic dielectric layer 154 falls within the principles and scope of the invention. Further, the number, the thickness and the arrangement of the first inorganic dielectric layers 152 and the second inorganic dielectric layers 154 depend on the required degree of reflection of the short wavelength light and the extent of moisture and oxygen preclusion.

Figure 2:
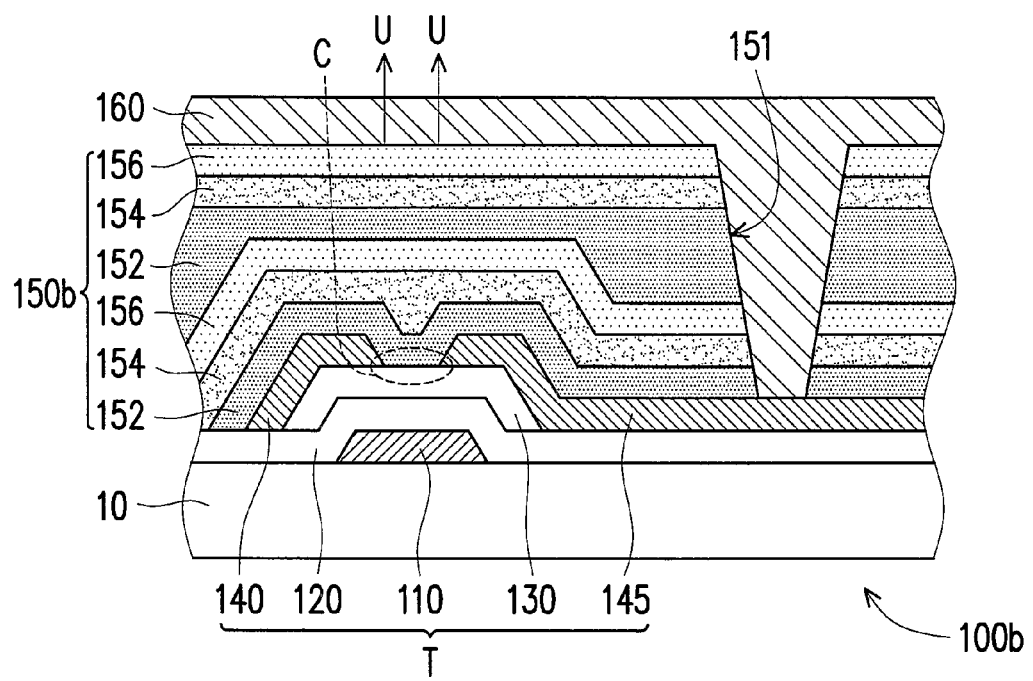
FIG. 2 is a schematic cross-sectional diagram of a semiconductor structure according to another exemplary embodiment of the disclosure.

FIG. 2 is a schematic cross-sectional diagram of a semiconductor structure according to another exemplary embodiment of the disclosure. Wherever possible, the same reference numbers are used in this and the previous exemplary embodiments to refer to the same or like parts, and further descriptions thereof are omitted.

Referring to FIG. 2, the difference between the semiconductor structure 100b of this exemplary embodiment and the semiconductor structure 100a of the previously exemplary embodiment lies in the dielectric stacked layer 150b of the semiconductor structure 100b further including a plurality of third inorganic dielectric layers 156 with a third refractive index. More particularly, the first inorganic dielectric layers 152, the second inorganic dielectric layers 154 and the third inorganic dielectric layers 156 are alternately disposed, and the third inorganic dielectric layers 156 may also have the capability of precluding moisture and oxygen penetrations. An example of the third inorganic dielectric layers 156 is, but not limited to, a silicon oxynitride layer, and the third refractive index of the third inorganic dielectric layers 156 is, for example, between 1.6 and 1.64.

In the semiconductor structure 100b of this exemplary embodiment, the dielectric stacked layer 150b, which may serve as a passivation layer of the thin film transistor T, is constructed with the alternately stacked first inorganic dielectric layers 152, second inorganic dielectric layers 154 and third inorganic dielectric layers 156 that are capable of precluding moisture and oxygen penetrations. Hence, not only oxygen and moisture may be effectively prevented from entering into the oxide channel layer 130 and the semiconductor structure 100b may have better stability and electrical properties, short wavelength lights U (such as UV lights) may be selectively reflected. Accordingly, the photocurrent generated by the oxide channel layer 130 due to light irradiation is reduced, and the photoelectric characteristics and the lifetime of the semiconductor structure 100b are also enhanced.

According to the above disclosure, the semiconductor structure of the exemplary embodiments of the disclosure includes a source, a drain and an oxide channel layer that are directly contacted dielectric stacked layer. Hence, not only oxygen and moisture may be effectively prevented from entering into the oxide channel layer and the semiconductor structure may have better stability and electrical properties, short wavelength lights U (such as UV lights) may be selectively reflected. Accordingly, the photocurrent generated by the oxide channel layer due to light irradiation is reduced, and the photoelectric characteristics and the lifetime of the semiconductor structure are also enhanced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor structure, comprising:
   a gate, disposed on a substrate;
   an oxide channel layer, disposed on the substrate and stacked on the gate;
   a gate insulating layer, disposed between the gate and the oxide channel layer;
   a source, disposed at a side of the oxide channel layer;
   a drain, disposed at the side of the oxide channel layer, and the source and the drain are configured in parallel, wherein a portion of the oxide channel layer is exposed between the source and the drain;
   a dielectric stacked layer, disposed on the substrate, and comprising a plurality of first inorganic dielectric layers with a first refractive index and a plurality of second inorganic dielectric layers with a second refractive index, wherein the plurality of first inorganic dielectric layers and the plurality of second inorganic dielectric layers are not alternately stacked, and at least one of the plurality of first inorganic dielectric layers directly covers the source, the drain and the portion of the oxide channel layer, and the first refractive index is smaller than the second refractive index.

2. The semiconductor structure as recited in claim 1, wherein each of the plurality of the first inorganic dielectric layers comprises a silicon oxide layer.

3. The semiconductor structure as recited in claim 2, wherein the first refractive index is between 1.535 and 1.56.

4. The semiconductor structure as recited in claim 1, wherein each of the plurality of second inorganic dielectric layers comprises a silicon nitride layer.

5. The semiconductor structure as recited in claim 4, wherein the second refractive index is between 1.98 and 2.08.

6. The semiconductor structure as recited in claim 1, wherein the dielectric stacked layer further comprises a plurality of third inorganic dielectric layers with a third refractive index, and the plurality of first inorganic dielectric layers, the plurality of second inorganic dielectric layers and the plurality of third inorganic dielectric layers are stacked with each other.

7. The semiconductor structure as recited in claim 6, wherein each of the plurality of third inorganic dielectric layers comprises a silicon oxynitride layer.

8. The semiconductor structure as recited in claim 6, wherein the third refractive index is between 1.6 and 1.64.

9. The semiconductor structure as recited in claim 1, wherein a number of the stacked layers constituting by the first inorganic dielectric layers and the second inorganic dielectric layers is at least five.

10. The semiconductor structure as recited in claim 1, wherein a thickness of each of the plurality of the first inorganic dielectric layers is between 55 nanometers and 85 nanometers.

11. The semiconductor structure as recited in claim 1, wherein a thickness of each of the second inorganic dielectric layers is between 55 nanometers and 85 nanometers.

12. The semiconductor structure as recited in claim 1, wherein a material of the oxide channel layer includes indium-gallium-zinc oxide (IGZO), zinc oxide (ZnO) or indium-zinc oxide (IZO).

13. The semiconductor structure as recited in claim 1 further comprising a transparent conductive layer, disposed on the dielectric stacked layer, wherein the dielectric stacked layer comprises a contact via, and the transparent conductive layer is electrically connected with the drain through the contact via.

* * * * *